(12) United States Patent
Seo

(10) Patent No.: US 10,686,457 B2
(45) Date of Patent: Jun. 16, 2020

(54) CIRCUIT DEVICE, OSCILLATOR, ELECTRONIC APPARATUS AND VEHICLE

(71) Applicant: SEIKO EPSON CORPORATION, Tokyo (JP)

(72) Inventor: Kentaro Seo, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/412,907

(22) Filed: May 15, 2019

(65) Prior Publication Data

US 2019/0356320 A1   Nov. 21, 2019

(30) Foreign Application Priority Data

May 16, 2018   (JP) .................................. 2018-094228

(51) Int. Cl.
  *H03L 7/099*  (2006.01)
  *H03L 1/02*   (2006.01)
  *H03L 7/093*  (2006.01)

(52) U.S. Cl.
  CPC ............ *H03L 7/0992* (2013.01); *H03L 1/028* (2013.01); *H03L 7/093* (2013.01)

(58) Field of Classification Search
  CPC .................................................. H03L 7/0092
  USPC ......................................................... 331/34
  See application file for complete search history.

(56) References Cited

U.S. PATENT DOCUMENTS

| 2003/0030475 A1* | 2/2003 | Ishikawa ................... H03L 7/07 327/291 |
| 2010/0214028 A1 | 8/2010 | Kobayashi |
| 2011/0032013 A1* | 2/2011 | Nelson ................... B60Q 1/444 327/156 |
| 2014/0232473 A1 | 8/2014 | Matsuda |

FOREIGN PATENT DOCUMENTS

| JP | 2010-199810 A | 9/2010 |
| JP | 2010/273185 A | 12/2010 |
| JP | 2011-023938 A | 2/2011 |
| JP | 2012-049659 A | 3/2012 |
| JP | 2012-049660 A | 3/2012 |
| WO | 2013/076797 A1 | 5/2013 |

* cited by examiner

*Primary Examiner* — Joseph Chang
(74) *Attorney, Agent, or Firm* — Oliff PLC

(57) ABSTRACT

A circuit device includes an oscillation signal generation circuit for generating an oscillation signal with an oscillation frequency set by frequency control data, and a processing circuit. The processing circuit includes a counter for performing a count process based on the oscillation signal, and a latch circuit for holding a count value of the counter based on a reference signal. The processing circuit performs a loop filter process on a phase comparison result based on output data of the latch circuit to output the frequency control data, holds information based on the phase comparison result when the holdover is detected, and outputs the frequency control data based on the information held, in a holdover period.

9 Claims, 9 Drawing Sheets

CIRCUIT DEVICE, OSCILLATOR, ELECTRONIC APPARATUS AND VEHICLE

The present application is based on, and claims priority from JP Application Serial Number 2018-094228, filed May 16, 2018, the disclosure of which is hereby incorporated by reference herein in its entirety.

BACKGROUND

1. Technical Field

The present disclosure relates to a circuit device, an oscillator, an electronic apparatus, a vehicle and so on.

2. Related Art

As a type of a PLL circuit, there has been known a digital PLL circuit which performs, for example, a loop filter process and a temperature compensation process using a digital process. Related art of the digital PLL circuit is disclosed in, for example, International Publication No. WO 2013/076797 (Document 1).

In Document 1, the PLL circuit includes a digital controlled oscillator (DOC), an FCW counter, a DCOCK counter, a time digital conversion circuit, a first latch circuit, a second latch circuit and an adder. Further, the FCW counter accumulates the FCW every time a reference clock signal is input, the DCOCK counter counts a clock signal output by the DCO, and the time digital conversion circuit measures a time difference between the reference clock and the clock signal output by the DCO. The first latch circuit holds a count value of the DCOCK counter with an edge of the reference clock signal, and the second latch circuit latches a digital value of the time difference output by the time digital conversion circuit with the edge of the reference clock signal. The adder subtracts output data of the first latch circuit from output data of the FCW counter, and then adds output data of the second latch circuit to the subtraction value. The loop filter performs the loop filter process on output data of the adder to generate frequency control data, and the DCO performs an oscillation operation based on the frequency control data to generate the clock signal.

In an oscillator for generating a clock signal synchronized with a reference signal, it is desired to continue to generate the clock signal in some cases, even if the oscillator comes into a holdover state in which the reference signal cannot be obtained. However, in Document 1, an operation in the holdover state is not disclosed. Specifically, in the configuration of Document 1, the first latch circuit latches the output data of the DCOCK counter every edge of the reference clock signal, and the data thus latched and the accumulated value of the FCW are compared with each other. Therefore, when the oscillator comes into the holdover state to stop the input of the reference clock signal, the PLL circuit stops the operation, and it is unachievable to oscillate the oscillator in a free-running manner.

SUMMARY

An aspect of the present disclosure relates to a circuit device including an oscillation signal generation circuit configured to generate an oscillation signal with an oscillation frequency set by frequency control data using the frequency control data and a resonator, and a processing circuit to which the oscillation signal and a reference signal are input, and which outputs the frequency control data to the oscillation signal generation circuit, wherein the processing circuit includes a counter configured to perform a count process a count period of which is set by a frequency control word, based on the oscillation signal, and a latch circuit configured to hold a count value of the counter based on the reference signal, and the processing circuit performs a loop filter process on a phase comparison result based on output data of the latch circuit to output the frequency control data, holds information based on the phase comparison result in a case in which holdover due to disappearance or a defect of the reference signal is detected, and outputs the frequency control data based on the information held, in a holdover period.

In the aspect of the present disclosure, the counter may perform the count process during the holdover period, and when recovering from the holdover, the latch circuit may latch the count value of the counter with an edge of the reference signal when the reference signal is determined to be normal, and the processing circuit may perform the loop filter process on the phase comparison result based on the output data of the latch circuit to output the frequency control data.

In the aspect of the present disclosure, the latch circuit may output data having a value in a range from −N(N is an integer no smaller than 2) set by the frequency control word to M (M is an integer no smaller than 2) set by the frequency control word as the output data of the latch circuit based on the count value held.

In the aspect of the present disclosure, the counter may perform the count process from an initial value to the M, and then perform the count process from the −N to the initial value, and the latch circuit may output the count value held as the output data of the latch circuit.

In the aspect of the present disclosure, in a case in which the reference signal is determined to be normal after startup of the circuit device, the processing circuit may set an initial value to the counter at an edge timing of the reference signal to start the count process of the counter.

In the aspect of the present disclosure, the processing circuit may include a second counter configured to count a number of clocks of the oscillation signal in one cycle of the reference signal, and may determine whether or not the reference signal is normal based on a count value of the second counter.

Other aspect of the present disclosure relates to an oscillator including any one of the circuit devices described above, and the resonator.

Another aspect of the present disclosure relates to an electronic apparatus including any one of the circuit devices described above.

Another aspect of the present disclosure relates to a vehicle including any one of the circuit devices described above.

DESCRIPTION OF EXEMPLARY EMBODIMENTS

Some preferred embodiments of the present disclosure will hereinafter be described in detail. It should be noted that the embodiments described hereinafter do not unreasonably limit the content of the present disclosure as set forth in the appended claims, and all of the constituents described in the embodiment are not necessarily essential as the measures for solving the problem of the present disclosure.

1. Circuit Device

Figure 1:
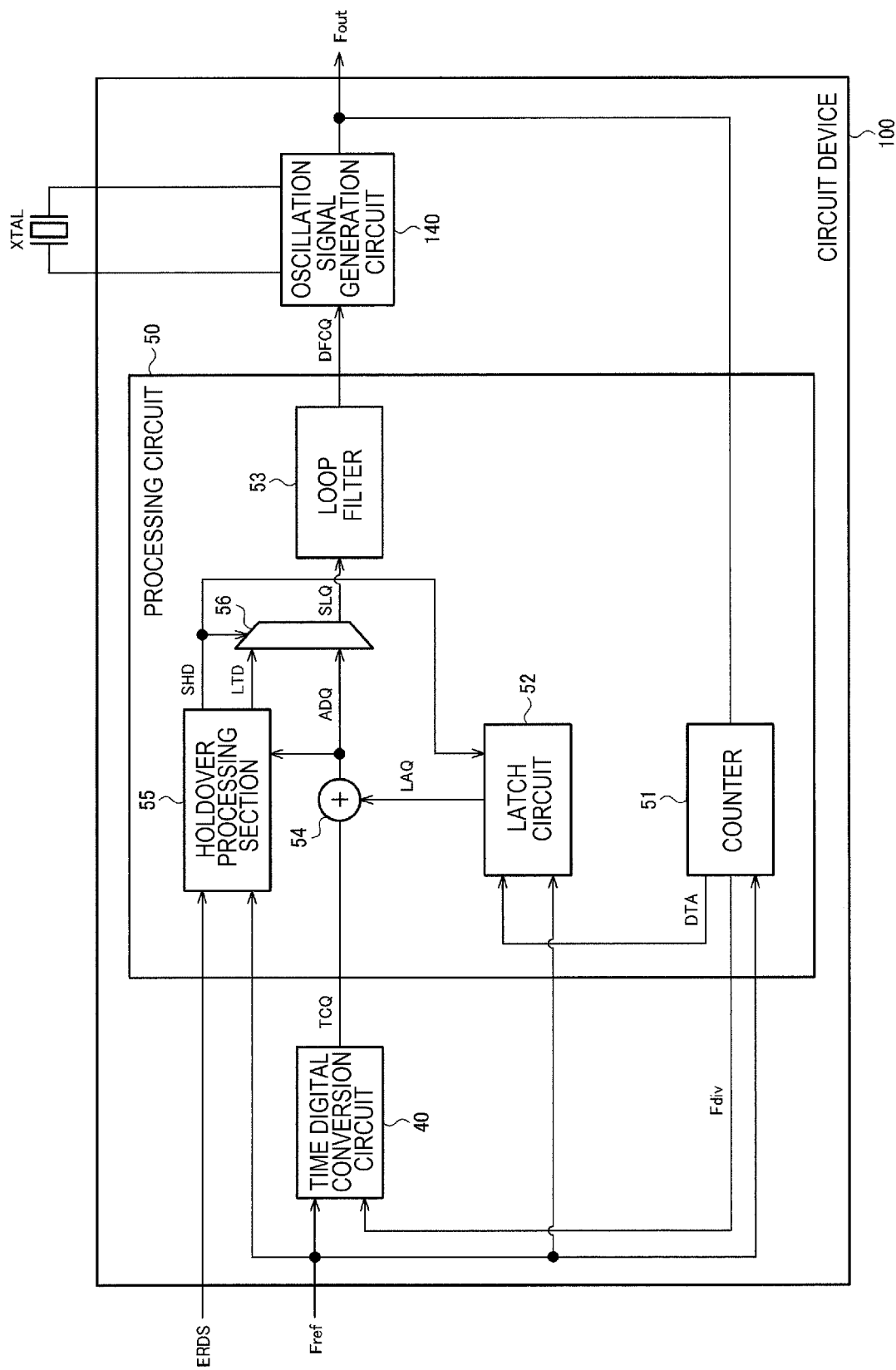
FIG. 1 is a diagram showing a first configuration example of a circuit device.
Figure 7:
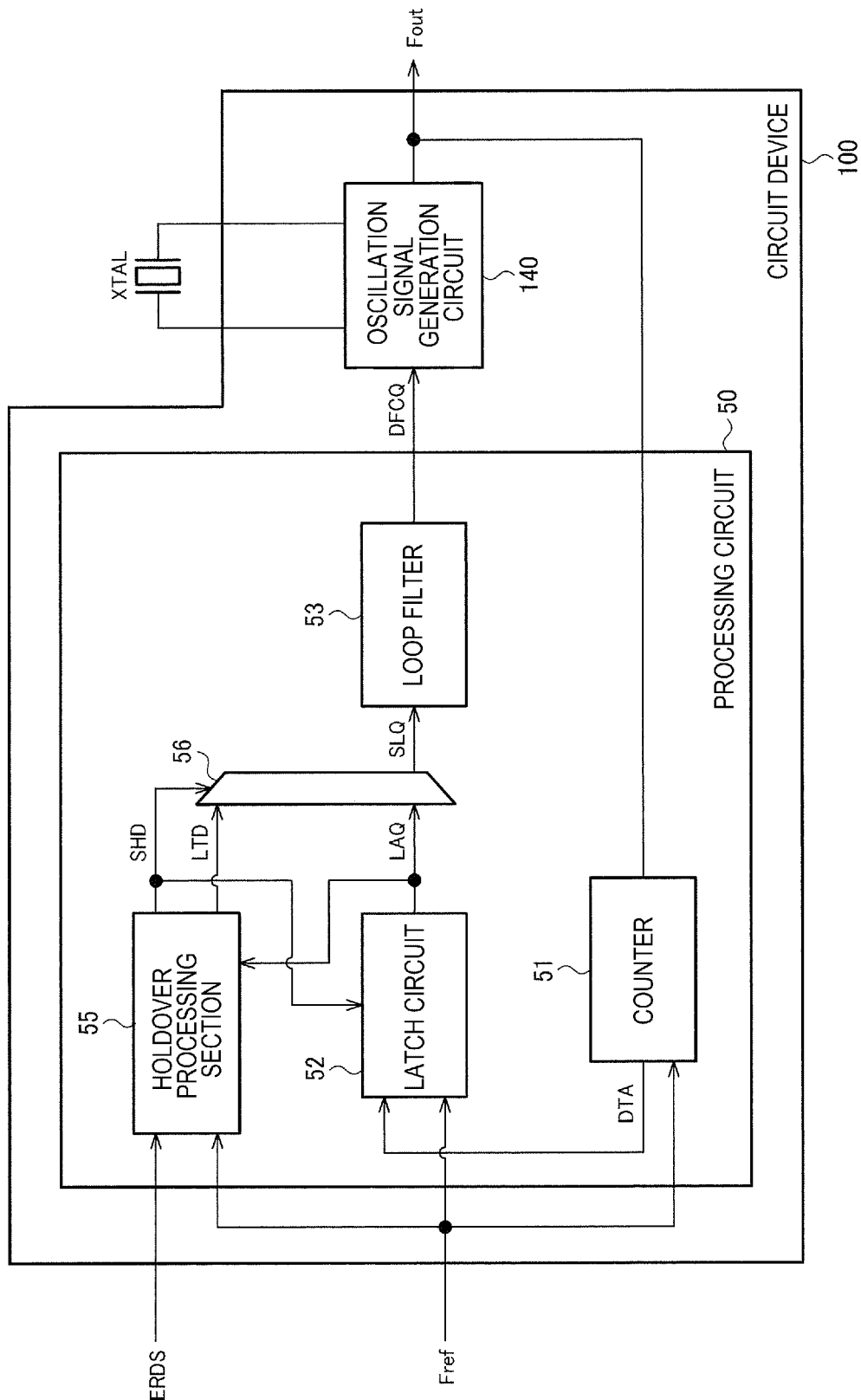
FIG. 7 is a diagram showing a second configuration example of the circuit device.

FIG. 1 shows a first configuration example of a circuit device 100. The circuit device 100 includes a time digital conversion circuit 40, a processing circuit 50 and an oscillation signal generation circuit 140. The circuit device 100 is, for example, an integrated circuit device. It should be noted that the circuit device is not limited to the configuration shown in FIG. 1, but there can be adopted a variety of practical modifications such as elimination of some of the constituents or addition of other constituents. For example, as shown in FIG. 7, it is also possible to eliminate the time digital conversion circuit.

To the processing circuit 50, there are input an oscillation signal Fout and a reference signal Fref, and the processing circuit 50 outputs frequency control data DFCQ to the oscillation signal generation circuit 140. Specifically, the processing circuit 50 generates the frequency control data DFCQ based on a phase difference between the oscillation signal Fout and the reference signal Fref so as to converge the phase difference on zero. Further, when the holdover due to disappearance or a defect of the reference signal Fref has been detected, the processing circuit 50 performs a holdover process. Specifically, in the holdover period, the processing circuit 50 generates the frequency control data DFCQ for making the oscillation signal generation circuit 140 operate in a free-running manner.

The reference signal Fref is a signal to be a reference for locking the phase of the oscillation signal Fout, and is a pulse signal or a clock signal. The reference signal Fref can be supplied from the outside of the circuit device 100, or can also be generated in the inside of the circuit device 100. For example, the reference signal Fref is a time pulse signal input from a GPS receiver. The frequency control data DFCQ is data for controlling the oscillation frequency of the oscillation signal Fout.

The processing circuit 50 includes a counter 51, a latch circuit 52, a loop filter 53, an adder 54, a holdover processing section 55 and a selector 56. The processing circuit 50 is a logic circuit. For example, the processing circuit 50 is a digital signal processor (DSP), and the DSP performs processes of the counter 51, the latch circuit 52, the loop filter 53, the adder 54, the holdover processing section 55 and the selector 56 in a time-sharing manner. Alternatively, it is also possible for each of the counter 51, the latch circuit 52, the loop filter 53, the adder 54, the holdover processing section 55 and the selector 56 to be configured as an individual circuit.

The oscillation signal generation circuit 140 generates the oscillation signal Fout with the oscillation frequency, which is set by the frequency control data DFCQ, using the frequency control data DFCQ and a resonator XTAL. For example, the oscillation signal generation circuit 140 oscillates the resonator XTAL at the oscillation frequency set by the frequency control data DFCQ to thereby generate the oscillation signal Fout. The details of the oscillation signal generation circuit 140 will be described later.

The resonator XTAL is, for example, a piezoelectric resonator. The piezoelectric resonator is, for example, a quartz crystal resonator. As the quartz crystal resonator, there can be cited a quartz crystal resonator vibrating in a thickness-shear mode having the cutting angle of, for example, AT-cut or SC-cut. For example, the resonator is a resonator incorporated in a temperature-compensated crystal oscillator (TCXO) not provided with a constant-temperature oven. Alternatively, the resonator can also be a resonator incorporated in an oven-controlled crystal oscillator (OCXO) equipped with a constant-temperature oven. Further, as the resonator, it is also possible to adopt a surface acoustic wave (SAW) resonator, an MEMS (micro electro-mechanical systems) resonator as a silicon resonator formed using a silicon substrate, and so on.

An operation of the circuit device 100 will hereinafter be described. Firstly, the operation of the holdover processing section 55 will be described, and then the operations of the circuit device 100 in a non-holdover state and in a holdover state will be described.

The holdover processing section 55 detects the holdover, and then outputs the detection result as a holdover detection signal SHD. Specifically, the holdover processing section 55 outputs the holdover detection signal SHD based on the result obtained by detecting the holdover inside, and an external determination signal ERDS supplied from the outside of the circuit device 100. The external determination signal ERDS is a signal supplied from, for example, the GPS receiver. In this case, the external determination signal ERDS is a signal representing the fact that it has become possible to supply a time pulse. It should be noted that it is possible for the holdover processing section 55 to output the holdover detection signal SHD based on the result obtained by detecting the holdover inside without using the external determination signal ERDS, or to output the holdover detection signal SHD based on the external determination signal ERDS without detecting the holdover inside.

Here, the holdover is the state in which the reference signal Fref has disappeared, or has become defective. For example, the holdover is the state in which the signal level of the reference signal Fref does not change, or the state in which the period of the reference signal Fref is inconstant or defective.

Then, the operation of the circuit device 100 in the non-holdover state will be described.

The counter 51 performs the count process based on the oscillation signal Fout. Specifically, the oscillation signal Fout is input to the counter 51, and the counter 51 counts the number of clocks of the oscillation signal Fout to output a count value DTA and a frequency-divided clock signal Fdiv. One cycle of the count process is set by a frequency control word, and the pulse of the frequency-divided clock signal Fdiv is output for each cycle. The frequency control word is input from, for example, a memory or a register not shown to the counter 51.

The latch circuit 52 holds the count value DTA of the counter 51 based on the reference signal Fref. Specifically, the latch circuit 52 latches the count value DTA with an edge of the reference signal Fref, then holds the count value DTA thus latched, and then outputs the count value DTA thus held as output data LAQ. The edge denotes a transition timing of a signal level, and is a rising edge or a falling edge.

The adder 54 adds the output data LAQ of the latch circuit 52 and output data TCQ of the time digital conversion circuit 40 to each other, and then outputs the addition result as phase difference data ADQ. The phase difference data ADQ is data representing the phase difference between an edge of the reference signal Fref and an edge of the frequency-divided clock signal Fdiv, and is a phase comparison result between the reference signal Fref and the frequency-divided clock signal Fdiv. In the case of expressing the phase difference assuming one cycle of the oscillation signal Fout as an integer "1," the output data LAQ of the latch circuit 52 corresponds to the integer part of the phase difference, and the output data TCQ of the time digital conversion circuit 40 corresponds to the fraction part of the phase difference.

The selector 56 selects the phase difference data ADQ or phase difference data LTD based on the holdover detection signal SHD, and then outputs the data thus selected as output data SLQ. In the non-holdover period, the selector 56 selects the phase difference data ADQ.

The loop filter 53 performs a loop filter process on the phase comparison result based on the output data SLQ of the selector 56 to output the frequency control data DFCQ. Specifically, the loop filter 53 performs the loop filter process on the phase difference data ADQ based on the output data LAQ of the latch circuit 52, and then outputs the processing result as the frequency control data DFCQ. The loop filter process is, for example, a process of smoothing the phase difference data ADQ, or a process of integrating the phase difference data ADQ. It should be noted that although the phase difference data ADQ output by the adder 54 corresponds to the phase comparison result in the example shown in FIG. 1, it is sufficient for the phase comparison result to be based on the output data LAQ of the latch circuit 52. For example, in an example shown in FIG. 7, the output data LAQ of the latch circuit 52 corresponds to the phase comparison result.

The time digital conversion circuit 40 converts the time difference between the edge of the reference signal Fref and the edge of the frequency-divided clock signal Fdiv into a digital value, and then outputs the digital value as the output data TCQ. The time resolution of the time digital conversion circuit 40 is finer than one cycle of the oscillation signal Fout. For example, the time digital conversion circuit 40 includes 1-st through n-th delay circuits on the reference signal side for sequentially delaying the reference signal Fref, 1-st through n-th delay circuits on the frequency-divided clock signal side for sequentially delaying the frequency-divided clock signal Fdiv, and 1-st through n-th comparison circuits. The i-th comparison circuit compares the delayed clock signal output by the i-th delay circuit on the reference signal side and the delayed clock signal output by the i-th delay circuit on the frequency-divided clock signal side with each other. The comparison results output by the 1-st through n-th comparison circuits become time-difference digital values. It should be noted that the conversion method of the time digital conversion circuit 40 is not limited to the above, but it is possible to adopt a variety of conversion methods such as a two-dimensional type using an array type comparison circuits.

As described above, in the non-holdover state, the time digital conversion circuit 40, the processing circuit 50 and the oscillation signal generation circuit 140 constitute the PLL circuit. The PLL circuit locks the phase of the oscillation signal Fout to the reference signal Fref so as to match the phases of the frequency-divided clock signal Fdiv and the reference signal Fref with each other. Defining the frequency division ratio of the counter 51 as DR, the frequency DR times as high as the frequency of the reference signal Fref becomes the frequency of the oscillation signal Fout. The frequency control word is the setting data for setting the frequency division ratio DR. For example, defining the frequency control word as FCW, FCW=DR is true. For example, when the frequency of the reference signal Fref is 1 [Hz], the frequency of the oscillation signal Fout is FCW [Hz].

It should be noted that in the case in which the holdover becomes not to be detected after the startup of the circuit device 100, the following operation is performed. That is, in the case in which the holdover becomes not to be detected after the startup of the circuit device 100, the counter 51 sets the count value DTA to an initial value. Specifically, in the case in which the holdover becomes not to be detected first time after the startup of the circuit device 100, the counter 51 sets the count value DTA to the initial value. The initial value is, for example, 0. At the time point of the initialization, the phase difference between the frequency-divided clock signal Fdiv and the reference signal Fref is zero. Further, the PLL circuit performs a pull-in operation of the oscillation signal Fout with reference to the reference signal Fref based on the subsequent phase comparison result.

Then, the operation of the circuit device 100 in the holdover state will be described.

The holdover processing section 55 outputs the phase difference data LTD used in the holdover period. Specifically, the holdover processing section 55 updates the phase difference data LTD based on the phase difference data ADQ in the non-holdover period. Then, the holdover processing section 55 holds the phase difference data LTD obtained at the transition from the non-holdover state to the holdover state, and then keeps the phase difference data LTD thus held during the holdover period.

In the holdover period, the selector 56 selects the phase difference data LTD. The loop filter 53 performs the loop filter process on the output data SLQ to output the frequency control data DFCQ. The operation of the oscillation signal generation circuit 140 is substantially the same as in the non-holdover period.

When the holdover is detected after the holdover becomes not to be detected for the first time, the counter 51 continues to count the number of clocks of the oscillation signal Fout. Next time the holdover becomes not to be detected, the counter 51 continues to count the number of clocks of the oscillation signal Fout without performing the initialization of the count value DTA. Thus, phase information between the frequency-divided clock signal Fdiv and the oscillation signal Fout is kept in the holdover period. In other words, in the case of separating the oscillation signal Fout by the FCW count, the phase relationship between the separation and the frequency-divided clock signal Fdiv is kept. When recovering from the holdover, the phase difference between the frequency-divided clock signal Fdiv and the reference signal Fref is locked once again. Therefore, the phase relationship between the reference signal Fref and the oscillation signal Fout is kept before and after the holdover period. In other words, the phase relationship between the separation obtained by separating the oscillation signal Fout by the FCW count and the reference signal Fref becomes the same before and after the holdover period.

According to the embodiment described above, the holdover processing section 55 holds the information based on the phase comparison result when the holdover due to disappearance or a defect of the reference signal Fref is detected. Then, in the holdover period, the loop filter 53 outputs the frequency control data DFCQ based on the information thus held.

In FIG. 1, the information based on the phase comparison result is the phase difference data LTD held by the holdover processing section 55 in the holdover period. Then, in the holdover period, the selector 56 selects the phase difference data LTD, then the loop filter process on the phase difference data LTD is performed to output the frequency control data DFCQ.

According to the present embodiment, even in the case in which the reference signal Fref becomes defective or disappears during the holdover period, since the processing circuit 50 outputs the frequency control data DFCQ, it is possible for the oscillation signal generation circuit 140 to operate in a free-running manner to generate the oscillation signal Fout. For example, in a base station or a network router using the oscillator including the circuit device 100 as a reference signal source, the reference signal is necessary also in the holdover period. According to the present embodiment, it is possible to supply the oscillation signal Fout as the reference signal to the base station, the network router and so on even in the holdover period.

Further, the oscillation frequency of the resonator XTAL varies due to a secular change called aging. The temporal change of the oscillation frequency due to the aging has a variation due to an individual variation. Further, the gradient of the temporal change of the oscillation frequency due to the aging varies gently with time. According to the present embodiment, when the holdover is detected, the information based on the phase comparison result is held. The phase comparison result is a result obtained by comparing the phases of the reference signal Fref and the frequency-divided clock signal Fdiv during the non-holdover period in which the reference signal Fref is normal. In other words, the phase comparison result includes the information of the oscillation frequency variation due to the aging. According to the present embodiment, in the holdover period, since the frequency control data DFCQ is output using the information based on the phase comparison result, it is possible to correct the temporal change of the oscillation frequency due to the aging. This correction is called an aging correction. Further, when the holdover is detected, the information based on the phase comparison result is held, and therefore, it is possible to perform the aging correction reflecting the gradient of the temporal change of the oscillation frequency when the holdover is detected. Thus, it is possible to perform the aging correction dealing with the individual variation and the change in gradient.

Further, in the present embodiment, the counter 51 performs the count process during the holdover period. Then, when recovering from the holdover, the latch circuit 52 holds the count value DTA of the counter 51 with the edge of the reference signal Fref when the reference signal Fref is determined to be normal. The loop filter 53 performs the loop filter process on the phase comparison result based on the output data LAQ of the latch circuit 52 to output the frequency control data DFCQ.

According to the present embodiment, since the counter 51 performs the count process during the holdover period, the phase information of the frequency-divided clock signal Fdiv in the holdover period is kept. Further, after the recovery from the holdover, since the latch circuit 52 latches the count value DTA with the edge of the reference signal Fref, the phase difference between the reference signal Fref and the frequency-divided clock signal Fdiv is detected, and the PLL circuit locks the phase of the frequency-divided clock signal Fdiv to the reference signal Fref based on the detection result. Thus, it is possible to keep the phase relationship between the frequency-divided signal Fdiv and the reference signal Fref before and after the holdover period.

In the case of using the oscillator including the circuit device 100 as the reference signal source in, for example, the base station or the network router, it is possible to use the oscillation signal Fout as the reference of the time in the base station or the network router. On this occasion, the frequency-divided clock signal Fdiv is synchronized with the reference signal Fref as the time pulse of the GPS or the like, and the frequency-divided clock signal Fdiv corresponds to the time pulse in the base station or the network router. In the case in which, for example, the reference signal Fref is a signal at 1 pulse per second (PPS), the frequency-divided clock signal Fdiv is a signal representing 1 second. If the phase relationship between the frequency-divided clock signal Fdiv representing 1 second and the oscillation signal Fout is different between before and after the holdover period, the reference of the time represented by the oscillation signal Fout is different between before and after the holdover period. As described above, in the present embodiment, since the phase relationship between the frequency-divided clock signal Fdiv and the oscillation signal Fout is kept during the holdover period, the reference of the time represented by the oscillation signal Fout can be made the same before and after the holdover period.

Further, in the present embodiment, first time the reference signal Fref is determined to be normal after the startup of the circuit device 100, the processing circuit 50 sets the initial value to the counter 51 at the edge timing of the reference signal Fref, and then starts the count process of the counter 51.

The startup of the circuit device 100 denotes the timing at which the PLL circuit including the processing circuit 50 and the oscillation signal generation circuit 140 starts the operation. The startup is, for example, the timing at which the circuit device 100 is powered on, or the timing at which reset of the circuit device 100 once made is released.

According to the present embodiment, by resetting the counter 51 first time the reference signal Fref is determined to be normal after the startup of the circuit device 100, it is possible to start the pull-in of the PLL circuit in the state in which at least the first edge of the reference signal Fref and the edge of the frequency-divided clock signal Fdiv coincide with each other. Thus, the reduction of the pull-in time can be expected. Further, the phase relationship between the frequency-divided signal Fdiv and the oscillation signal Fout is fixed when resetting the counter 51, and the phase relationship is kept until the counter 51 is reset once again. For example, since the phase relationship between the frequency-divided clock signal Fdiv and the oscillation signal Fout is kept during the holdover period as described above, the reference of the time represented by the oscillation signal Fout can be made the same before and after the holdover period.

Further, as described later with reference to FIG. 4, the processing circuit 50 includes a counter 611 (a second counter) for counting the number of clocks of the oscillation signal Fout in one cycle of the reference signal Fref. Further, the processing circuit 50 determines whether or not the reference signal Fref is normal based on the count value of the counter 611.

According to such an operation, it is possible to detect the holdover inside the circuit device 100, and it is possible to perform the operation in the holdover period based on the detection result. For example, it is possible to operate the oscillation signal generation circuit 140 in a free-running manner during the holdover period, or it is possible for the processing circuit 50 to perform the aging correction.

2. Counter

Figure 2:
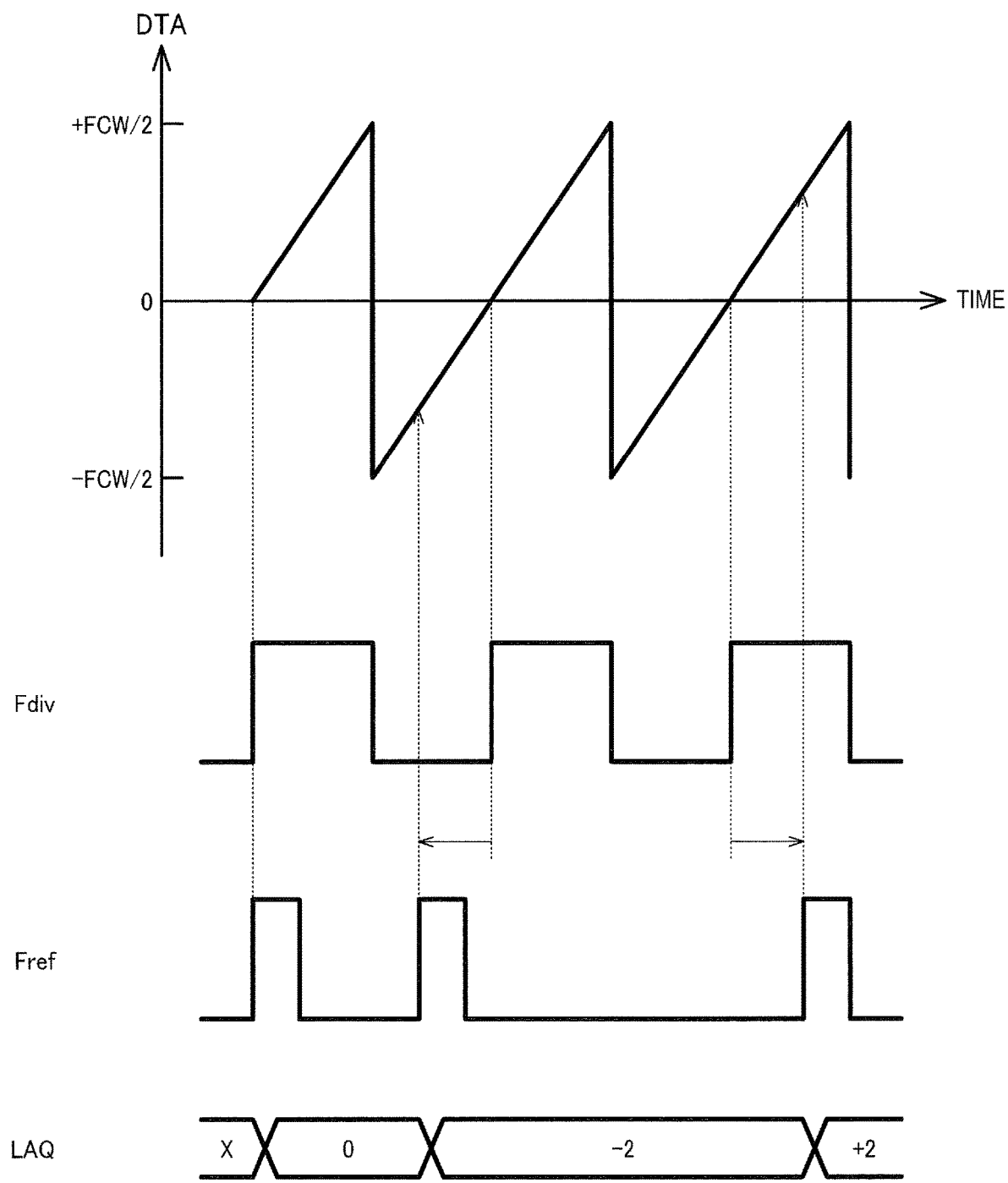
FIG. 2 is a waveform chart for explaining an operation of the circuit device.

FIG. 2 is a waveform chart for explaining the operation of the circuit device 100 in the non-holdover state. As shown in FIG. 2, the counter 51 counts up from the count value DTA=0 to the count value DTA=+FCW/2−1. The counter 51 outputs DTA=−FCW/2 as a next count value of the count value DTA=+FCW/2−1, and counts up from the count value DTA=−FCW/2 to the count value DTA=−1. This makes one cycle of the count operation, and thereafter, substantially the same count operation is repeated. FCW is the frequency control word, and the sum of the count number in one cycle of the count operation is FCW.

The counter 51 outputs a rising edge of the frequency-divided clock signal Fdiv at the timing of the transition of the count value DTA from −1 to 0, and outputs a falling edge of the frequency-divided clock signal Fdiv at the timing of the transition of the count value DTA from +FCW/2−1 to −FCW/2. The frequency division ratio of the frequency-divided clock signal Fdiv to the oscillation signal Fout is FCW.

The latch circuit 52 latches the count value DTA with the rising edge of the reference signal Fref. In the case in which the rising edge of the reference signal Fref and the rising edge of the frequency-divided clock signal Fdiv coincide with each other, the latch circuit 52 latches DTA=0. In the case in which the rising edge of the reference signal Fref is located anterior to the rising edge of the frequency-divided clock signal Fdiv, the latch circuit 52 latches a negative count value. In the example shown in FIG. 2, the latch circuit 52 latches DTA=−2. This corresponds to the case in which the phase difference of the frequency-divided clock signal Fdiv to the reference signal Fref is negative. In the case in which the rising edge of the reference signal Fref is located posterior to the rising edge of the frequency-divided clock signal Fdiv, the latch circuit 52 latches a positive count value. In the example shown in FIG. 2, the latch circuit 52 latches DTA=+2. This corresponds to the case in which the phase difference of the frequency-divided clock signal Fdiv to the reference signal Fref is positive.

According to the embodiment described hereinabove, the processing circuit 50 includes the counter 51 for performing the count process based on the oscillation signal Fout, and the latch circuit 52 for holding the count value DTA of the counter 51 based on the reference signal Fref. Further, based on the count value DTA thus held, the latch circuit 52 outputs the data having the value in the range from −N(N is an integer no smaller than 2) set by the frequency control word to M (M is an integer no smaller than 2) set by the frequency control word as the output data LAQ. Then, the loop filter 53 performs the loop filter process on the phase comparison result based on the output data LAQ of the latch circuit 52 to output the frequency control data DFCQ.

In the example shown in FIG. 2, N=FCW/2 is assumed, and M=FCW/2−1 is assumed. The latch circuit 52 outputs the data of the value in a range from −FCW/2 to 0 with respect to the negative phase difference, and outputs the data of the value in a range from 0 to +FCW/2−1 with respect to the positive phase difference. On this occasion, the larger the absolute value of the phase difference is, the larger the absolute value of the output data becomes. It should be noted that the integers N, M are not limited to N=FCW/2 and M=FCW/2−1, but are sufficient to be integers fulfilling N+M+1=FCW.

According to the present embodiment, the latch circuit 52 holds the count value DTA of the counter 51 based on the reference signal Fref, and outputs the output data LAQ based on the count value DTA thus held. In this case, the output data LAQ is the data having the value in the range from −N to M. The output data LAQ is the integer part of the phase difference, and is the value in the range from −N to M, and therefore includes the information of the sign and the absolute value of the phase difference. In other words, according to the present embodiment, it is possible to output the output data LAQ corresponding to the phase difference from the count value DTA held by the latch circuit 52 without determining the sign and the absolute value of the phase difference separately from each other. As described above, in the case of determining the sign and the absolute value of the phase difference separately from each other, there is a possibility that the detection error of the phase difference affects the oscillation characteristic of the PLL circuit. In this regard, according to the present embodiment, it is possible to reduce the detection error of the phase difference.

As is explained with reference to FIG. 2, the counter 51 performs the count process from the initial value to M=FCW/2−1, and then performs the count process from −N=−FCW/2 to the initial value. Although the initial value is 0 in FIG. 2, it is sufficient for the initial value to be a value in the range from −N to M. The latch circuit 52 outputs the count value DTA thus held as the output data LAQ.

According to the present embodiment, since the counter 51 outputs the value in the range from −N to M as the count value DTA, by the latch circuit 52 holding the count value DTA and then outputting the count value DTA as the output data LAQ, it is possible for the latch circuit 52 to output the value in the range from −N to M as the output data LAQ.

It should be noted that although the count value DTA and the output data LAQ of the latch circuit 52 have the same value in FIG. 2, this is not a limitation, and it is also possible for the latch circuit 52 to perform a conversion process on the count value DTA thus held to output the output data LAQ.

For example, the counter 51 counts down from 0 to −FCW/2, then outputs FCW/2−1 subsequently to −FCW/2, and then counts down from FCW/2−1 to zero. The latch circuit 52 inverts the sign of the count value DTA thus held, and then outputs the result as the output data LAQ. According to this process, substantially the same output data LAQ as shown in FIG. 2 can be obtained as a result.

Figure 3:
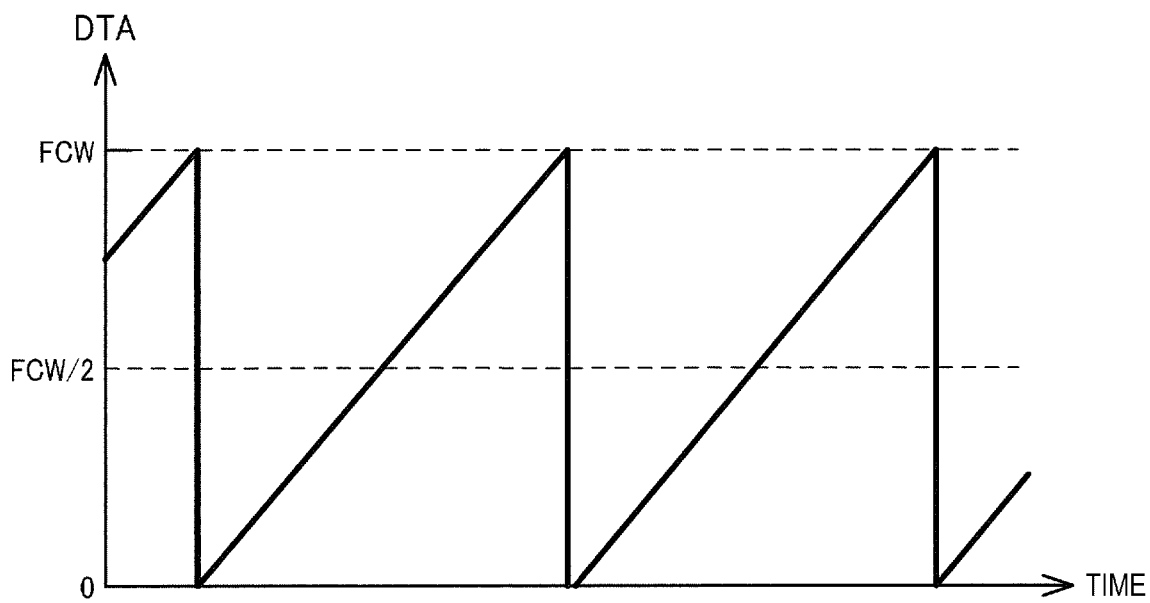
FIG. 3 is a waveform chart for explaining an operation of the circuit device.
Figure 3:
Figure 3:
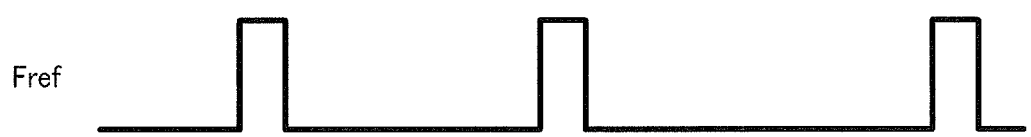
Figure 3:
Figure 3:

Alternatively, as shown in FIG. 3, it is possible for the counter 51 to count up from 0 to FCW−1. The counter 51 outputs the rising edge of the frequency-divided clock signal Fdiv at the timing of the transition of the count value from FCW−1 to 0, and outputs the falling edge of the frequency-divided clock signal Fdiv at the timing of the transition of the count value from FCW/2−1 to FCW/2. Defining the count value held by the latch circuit 52 as LAQ', the latch circuit 52 outputs the output data LAQ=LAQ' in the case of $0 \leq LAQ' \leq FCW/2-1$. In the example shown in FIG. 3, LAQ=10 is output in the case of LAQ'=10. This corresponds to the case in which the phase difference of the frequency-divided clock signal Fdiv to the reference signal Fref is positive. In the case of $FCW/2 \leq LAQ' \leq FCW-1$, the latch circuit 52 outputs the output data LAQ=LAQ'-FCW. In the example shown in FIG. 3, LAQ=−5 is output in the case of LAQ'=FCW−5. This corresponds to the case in which the phase difference of the frequency-divided clock signal Fdiv to the reference signal Fref is negative. According to this process, substantially the same output data LAQ as shown in FIG. 2 can be obtained as a result.

3. Detailed Configuration Example

Figure 4:
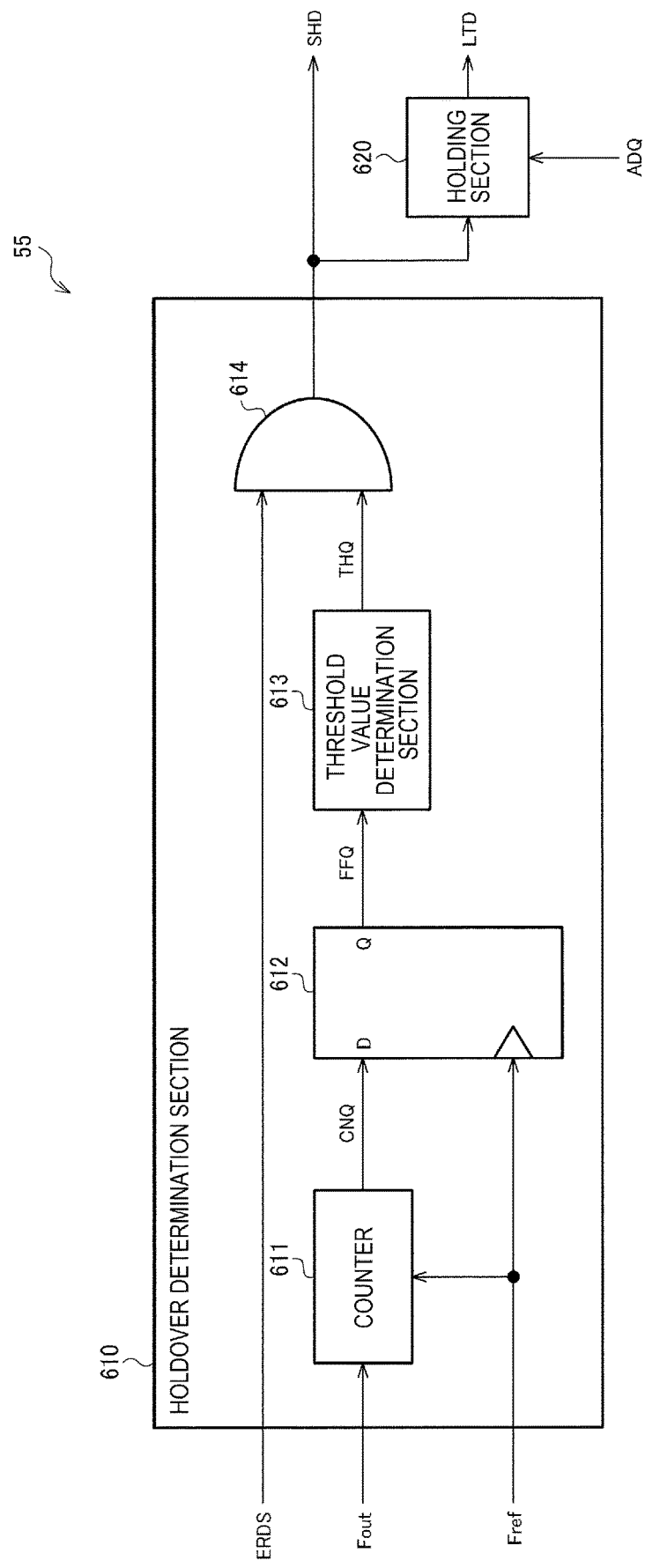
FIG. 4 is a diagram showing a detailed configuration example of a holdover processing section.

FIG. 4 shows a detailed configuration example of the holdover processing section 55. The holdover processing section 55 includes a holdover determination section 610 for determining whether or not the oscillator is in the holdover state, and a holding section 620 for holding the phase difference data LTD used during the holdover period.

The holdover determination section 610 includes a counter 611, a latch circuit 612, a threshold value determination section 613 and an AND circuit 614. The counter 611 counts the number of clocks of the oscillation signal Fout between the edges of the reference signal Fref, and then outputs data CNQ of the number of the clocks. In other words, the counter 611 counts the number of the clocks of the oscillation signal Fout during one cycle of the reference signal Fref. The latch circuit 612 latches the data CNQ of the number of the clocks with the edge of the reference signal Fref, and then outputs the data CNQ thus latched as data FFQ. The threshold value determination section 613 determines whether or not $FCW-\alpha \leq FFQ \leq FCW+\alpha$ is true, and then outputs internal determination signal THQ based on the determination result. For example, in the case in which $FCW-\alpha \leq FFQ \leq FCW+\alpha$ is continuously fulfilled for a predetermined cycles of the reference signal Fref, the threshold determination section 613 determines that the reference signal Fref is normal, and then sets the internal determination signal THQ to a high level. To the holdover determination section 610, there is input an external determination signal ERDS. For example, when the GPS receiver becomes to be able to output the time pulse, the external determination signal ERDS is set to the high level. The AND circuit 614 outputs the logical product of the internal determination signal THQ and the external determination signal ERDS as the holdover detection signal SHD.

The holding section 620 updates the phase difference data LTD based on the phase difference data ADQ in the case in which the holdover detection signal SHD is in the high level. The phase difference data ADQ is a result of detecting the phase difference between the frequency-divided clock signal Fdiv and the reference signal Fref. For example, when the phase difference data ADQ is updated, the phase difference data LTD is updated assuming LTD=ADQ. Alternatively, the holding section 620 performs a smoothing process on the phase difference data ADQ, and then sets the result to the phase difference data LTD. When the holdover detection signal SHD has changed from the high level to a low level, the holding section 620 holds the phase difference data LTD obtained at that timing, and then outputs the phase difference data LTD thus held during the holdover period.

Figure 5:
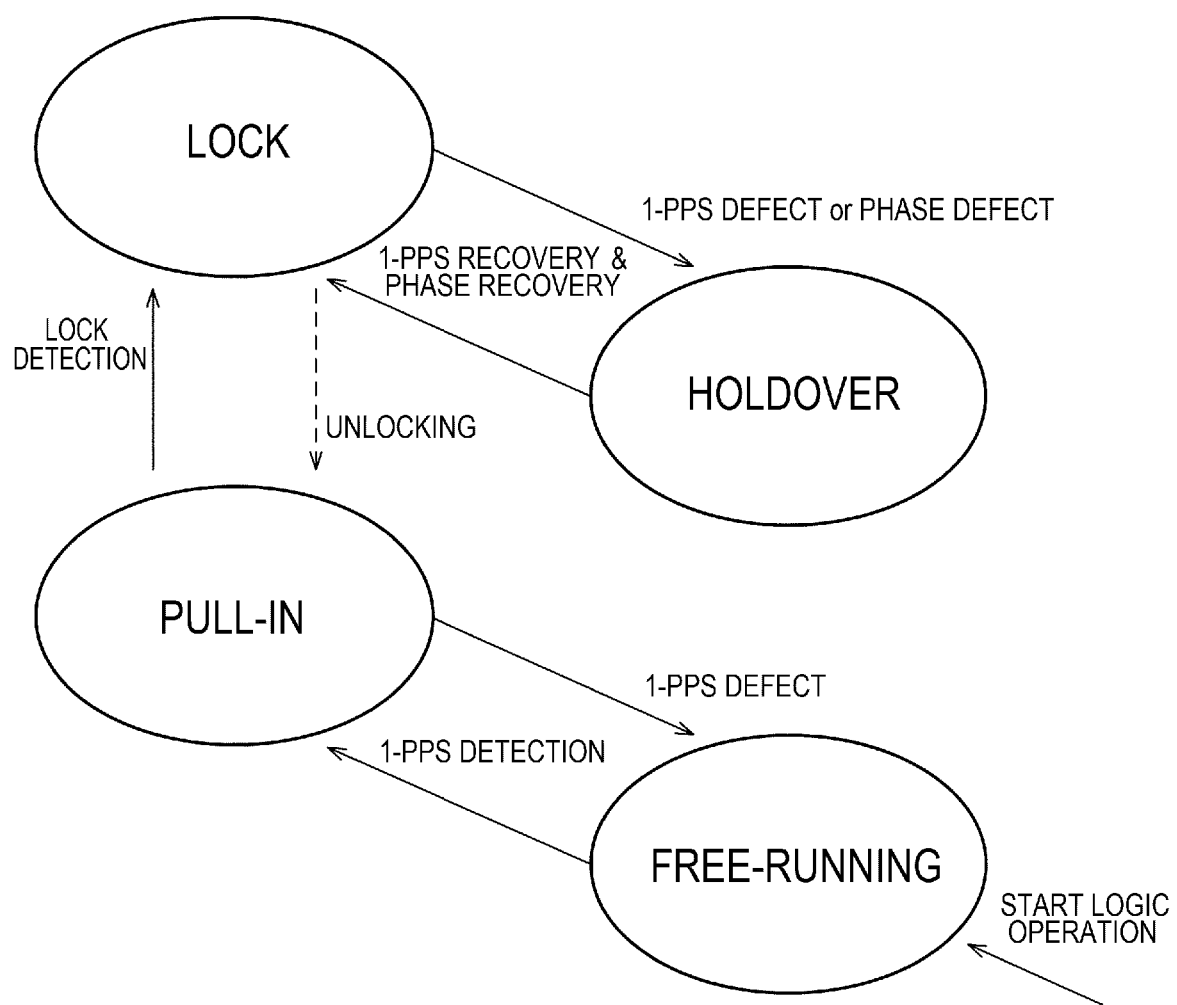
FIG. 5 is a state transition diagram for explaining an operation of a PLL circuit.

FIG. 5 is a state transition diagram for explaining an operation of the PLL circuit according to the present embodiment. The PLL circuit makes the transition between four states, namely a free-running state, a pull-in state, a lock state and the holdover state. It should be noted that hereinafter the case in which the reference signal Fref is a signal at 1 PPS is described as an example, and the reference signal Fref is also described as "1-PPS." It should be noted that the reference signal Fref is not limited to a signal at 1 PPS.

When the processing circuit 50 starts the logic operation, the PLL circuit comes into the free-running state. The free-running state is a state in which the feedback control based on the phase comparison result between the reference signal Fref and the frequency-divided clock signal Fdiv is not performed, and the oscillation signal generation circuit 140 oscillates in a free-running manner.

In the free-running state, when the holdover processing section 55 has detected the normal 1-PPS, the PLL circuit makes the transition to the pull-in state. The processing circuit 50 initializes the counter 51 with the first rising edge of the reference signal Fref after the transition to the pull-in state, and then starts the phase comparison between the frequency-divided clock signal Fdiv and the reference signal Fref.

In the pull-in state, in the case in which the holdover processing section 55 has detected a defect or disappearance of the 1-PPS, the PLL circuit makes the transition to the free-running state.

In the pull-in state, when the processing circuit 50 has detected that the frequency-divided clock signal Fdiv has been locked to the reference signal Fref, the PLL circuit makes the transition to the lock state. For example, the processing circuit 50 monitors the phase difference data ADQ or the output data LAQ of the latch circuit 52, and when the processing circuit 50 has detected that the phase difference is equal to or lower than the threshold value, the processing circuit 50 determines that the frequency-divided clock signal Fdiv has been locked to the reference signal Fref.

In the lock state, when the processing circuit 50 has detected that the frequency-divided clock signal Fdiv fails to be locked to the reference signal Fref, the PLL circuit makes the transition to the pull-in state.

In the lock state, in the case in which the holdover processing section 55 has detected the defect or disappearance of the 1-PPS, the PLL circuit makes the transition to the holdover state. In the holdover state, the processing circuit 50 does not perform the phase comparison between the reference signal Fref and the frequency-divided clock signal Fdiv, but inputs the phase difference data LTD output by the holdover processing section 55 to the loop filter 53. Further, in the holdover state, the counter 51 continues the count process.

In the holdover state, when the holdover processing section 55 has detected that the 1-PPS has become normal, the PLL circuit performs the pull-in operation and then makes the transition to the lock state.

Figure 6:
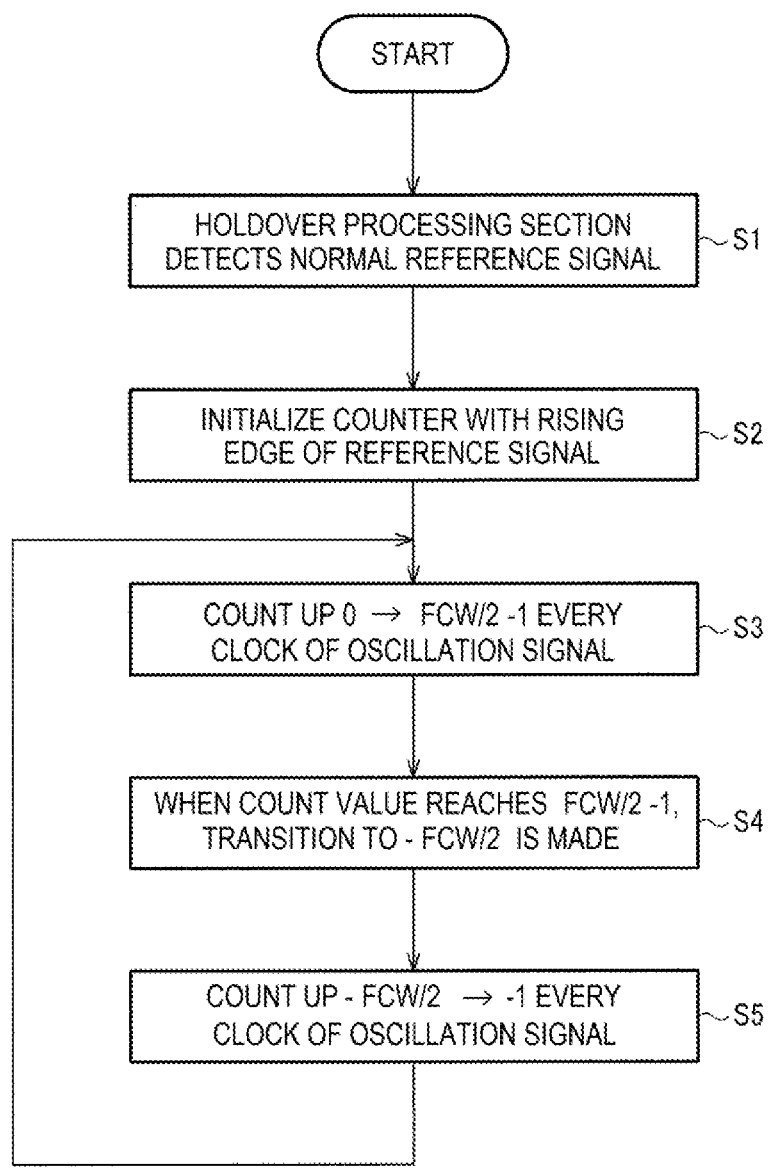
FIG. 6 is a flowchart showing a flow of the transition from a free-running state to a pull-in state, and a process in the pull-in state.

FIG. 6 is a flowchart showing a flow of the transition from the free-running state to the pull-in state, and a process in the pull-in state.

As shown in the step S1 in FIG. 6, when the holdover processing section 55 has detected that the 1-PPS is normal in the free-running state, the transition to the pull-in state is made. As shown in the step S2, the processing circuit 50 initializes the counter 51 with the rising edge of the reference signal Fref. Specifically, the count value is initialized to an initial value of 0. As shown in the step S3, the counter 51 counts up from 0 to FCW/2−1 one by one for each clock of the oscillation signal Fout. As shown in the step S4, when the count value reaches FCW/2−1, the counter 51 makes the transition of the count value to −FCW/2. As shown in the step S5, the counter 51 counts up from −FCW/2 to −1 one by one for each clock of the oscillation signal Fout. When the count value reaches −1, the process returns to the step S3, and the counter 51 starts counting up once again from 0.

4. Second Configuration Example

FIG. 7 shows a second configuration example of the circuit device 100. It should be noted that hereinafter, the same constituents as the constituents having already been described are denoted by the same reference numerals, and the description of such constituents will arbitrarily be omitted.

In FIG. 7, the time digital conversion circuit 40 and the adder 54 of the processing circuit 50 are omitted. Further, the output data LAQ of the latch circuit 52 is input to the selector 56 and the holdover processing section 55 as the phase comparison result.

In the non-holdover period, the selector 56 selects the output data LAQ of the latch circuit 52. The loop filter 53 performs the loop filter process on the output data LAQ of the latch circuit 52, and then outputs the processing result as the frequency control data DFCQ. The oscillation signal generation circuit 140 generates the oscillation signal Fout with the oscillation frequency set by the frequency control data DFCQ. The counter 51 performs the count process based on the oscillation signal Fout to output the count value DTA, and the latch circuit 52 holds the count value DTA based on the reference signal Fref.

The holdover processing section 55 updates the phase difference data LTD based on the output data LAQ of the latch circuit 52 in the non-holdover period. Then, the holdover processing section 55 holds the phase difference data LTD obtained at the transition from the non-holdover state to the holdover state, and then keeps the phase difference data LTD thus held during the holdover period.

In the holdover period, the selector 56 selects the phase difference data LTD. The loop filter 53 performs the loop filter process on the output data SLQ to output the frequency control data DFCQ. The oscillation signal generation circuit 140 generates the oscillation signal Fout with the oscillation frequency set by the frequency control data DFCQ.

In the present embodiment, the processing circuit 50 and the oscillation signal generation circuit 140 constitute the PLL circuit in the non-holdover period. Further, as the phase comparison result based on the output data LAQ of the latch circuit 52, the output data LAQ is input to the loop filter 53. Specifically, the fraction part of the phase difference is not detected, but the integer part of the phase difference output by the latch circuit 52 is input to the loop filter 53. The operations of the counter 51 and the latch circuit 52 are substantially the same as the operations described with reference to FIG. 1 through FIG. 3. Specifically, the latch circuit 52 outputs the data with a value in the range from −N to M as the output data LAQ based on the count value DTA thus held. Thus, it is possible to reduce the detection error in the phase difference similarly to the first configuration example.

5. Oscillator, Electronic Apparatus, and Vehicle

Figure 8:
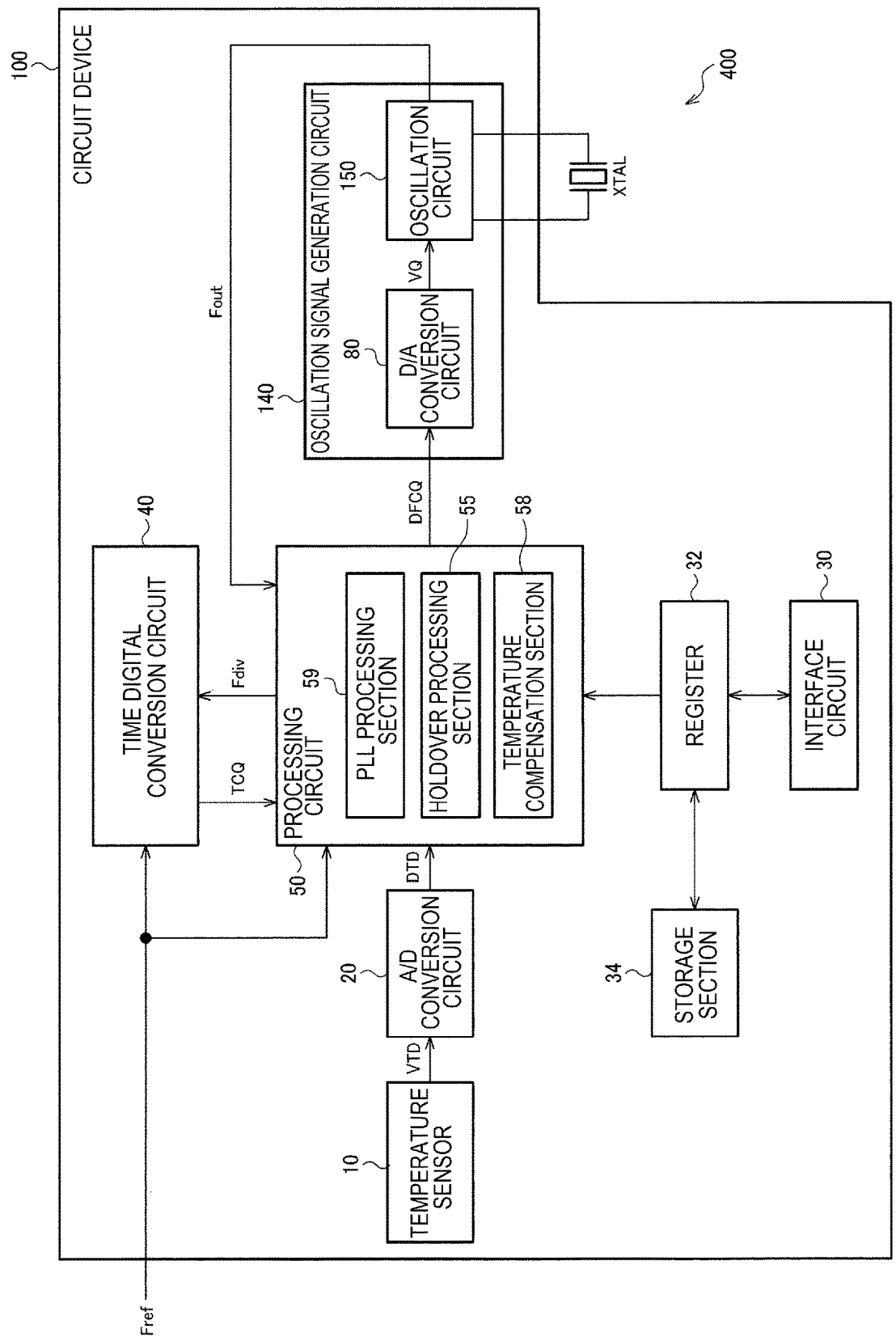
FIG. 8 is a diagram showing a configuration example of an oscillator and a fourth configuration example of the circuit device.

FIG. 8 is a diagram showing a configuration example of an oscillator 400 and a fourth configuration example of the circuit device 100. The oscillator 400 includes the resonator XTAL and the circuit device 400. For example, the resonator XTAL and the circuit device 100 are housed in a package.

The circuit device 100 includes a temperature sensor 10, an A/D conversion circuit 20, an interface circuit 30, a register 32, a storage section 34, the time digital conversion circuit 40, the processing circuit 50 and the oscillation signal generation circuit 140. It should be noted that hereinafter, the same constituents as the constituents having already been described are denoted by the same reference numerals, and the description of such constituents will arbitrarily be omitted.

The temperature sensor 10 outputs a temperature detection voltage VTD varying in accordance with the environmental temperature. The environmental temperature is the temperature of the environment of the resonator XTAL. For example, the circuit device 100 is an integrated circuit device, and the environmental temperature is the temperature of the semiconductor substrate of the integrated circuit device. It should be noted that the temperature sensor 10 can also be disposed outside the circuit device 100. In this case, for example, the temperature of the constant-temperature oven of the OCXO corresponds to the environmental temperature. The temperature sensor 10 can be formed of a diode, a bipolar transistor and so on. Further, the forward voltage of the P-N junction included in the diode, the bipolar transistor and so on corresponds to the temperature detection voltage VTD.

The A/D conversion circuit 20 performs the A/D conversion of the temperature detection voltage VTD to output the temperature detection data DTD. For example, the digital temperature detection data DTD corresponding to the A/D conversion result of the temperature detection voltage VTD is output. As the A/D conversion method of the A/D conversion circuit 20, there can be adopted, for example, a successive approximation method, a parallel comparison type and a delta-sigma type.

The processing circuit 50 generates the frequency control data DFCQ based on the temperature detection data DTD, the oscillation signal Fout, the reference signal Fref and the output data TCQ of the time digital conversion circuit 40. The processing circuit 50 includes a PLL processing section 59, the holdover processing section 55 and a temperature compensation section 58.

The PLL processing section 59 includes the counter 51, the latch circuit 52, the loop filter 53 and the adder 54. As described with reference to FIG. 1 through FIG. 7, the PLL processing section 59 obtains the phase difference data ADQ representing the phase difference between the frequency-divided clock signal Fdiv output by the counter 51 and the reference signal Fref, and the loop filter 53 performs the loop filter process on the phase difference data ADQ.

The temperature compensation section 58 performs a temperature compensation process for compensating the temperature characteristic of the oscillation frequency of the resonator XTAL based on the temperature detection data DTD. Specifically, the temperature compensation section 58 substitutes the temperature detection data DTD to the approximation function for reducing the variation of the oscillation frequency due to the temperature variation to thereby obtain the temperature compensation data. The temperature compensation section 58 corrects the output data of the loop filter 53 based on the temperature compensation data, and then outputs the data thus corrected as the frequency control data DFCQ.

The oscillation signal generation circuit 140 generates the oscillation signal Fout based on the frequency control data DFCQ. The oscillation signal generation circuit 140 includes a D/A conversion circuit 80 and an oscillation circuit 150.

The D/A conversion circuit 80 performs D/A conversion on the frequency control data DFCQ to output a control voltage VQ corresponding to the frequency control data DFCQ. As a type of the D/A conversion circuit 80, it is possible to adopt a variety of types such as a resistance string type, a resistance ladder type or a capacitance array type.

The oscillation circuit 150 generates an oscillation signal using the control voltage VQ and the resonator XTAL. The oscillation circuit 150 is connected to the resonator XTAL, and oscillates the resonator XTAL with the oscillation frequency controlled by the control voltage VQ to thereby generate the oscillation signal. For example, the oscillation circuit 150 is a voltage controlled oscillator (VCO). The VCO includes a drive circuit for driving the resonator XTAL and a variable-capacitance capacitor. The drive circuit has a first node connected to one end the resonator XTAL, and a second node connected to the other end of the resonator XTAL. One end of the variable-capacitance capacitor is connected to the first node or the second node, and by the capacitance value of the variable-capacitance capacitor being controlled by the control voltage VQ, the oscillation frequency is controlled.

It should be noted that the configuration of the oscillation signal generation circuit 140 is not limited to the configuration shown in FIG. 8, but it is sufficient for the oscillation signal generation circuit 140 to be a circuit for generating the oscillation signal using the frequency control data DFCQ and the resonator. For example, it is also possible for the oscillation signal generation circuit 140 to include the oscillation circuit and a variable-capacitance circuit to be connected to the oscillation circuit. The variable-capacitance circuit has a capacitor array, and a switch array in which ON/OFF of each of the switch elements is controlled based on the frequency control data DFCQ. By setting each of the switch elements to the ON state or the OFF state, the number of the capacitors connected to the one end of the resonator XTAL in the capacitor array varies. Thus, the capacitance value of the variable-capacitance circuit is controlled, and thus, the oscillation frequency is controlled. Alternatively, the oscillation signal generation circuit 140 can also be realized using a direct digital synthesizer method. In this case, by performing the digital computing process based on the frequency control data LQ on the oscillation signal of the resonator XTAL, the oscillation signal Fout with the oscillation frequency corresponding to the frequency control data DFCQ is generated. Alternatively, it is also possible for the oscillation signal generation circuit 140 to generate the oscillation signal using an atomic oscillator equipped with a resonator.

The interface circuit 30 is an interface for inputting/outputting digital data between the circuit device 100 and an external device. The external device is, for example, a central processing unit (CPU), a microcomputer, or a controller. The interface circuit 30 can be realized by, for example, a synchronous serial communication system using a serial clock line and a serial data line. Specifically, it can be realized by an I²C (Inter Integrated Circuit) system, a three-line or four-line SPI (Serial Peripheral Interface) system, or the like. The interface circuit 30 is constituted by an input/output buffer circuit, a control circuit, and so on for realizing these communication systems.

The storage section 34 is for storing a variety of types of information necessary for a variety of types of processing and operations of the circuit device 100. For example, the storage section 34 stores parameters to be used for the temperature compensation process. The storage section 34 can be realized by, for example, a nonvolatile memory. As the nonvolatile memory, there can be used, for example, an EEPROM. It should be noted that the storage section 34 is only required to be able to hold and store the information even if the power is not supplied, and can also be realized using, for example, a fuse circuit.

The register 32 is a circuit constituted by a plurality of registers such as a status register, a command register, and a data register. The external device of the circuit device 100 accesses the registers in the register 32 via the interface circuit 30. Further, it becomes possible for the external device to check the status of the circuit device 100, issue a command to the circuit device 100, transmit data to the circuit device 100, retrieve data from the circuit device 100, and so on using the registers in the register 32. Further, the register 32 stores the information retrieved from the storage section 34. For example, the storage section 34 stores the frequency control word FCW, and the frequency control word FCW is retrieved in the register 32 when starting up the circuit device 100. Then, the processing circuit 50 performs the process with reference to the register 32. It should be noted that it is also possible for the external device to write the frequency control word FCW into the register 32 via the interface circuit 30.

Figure 9:
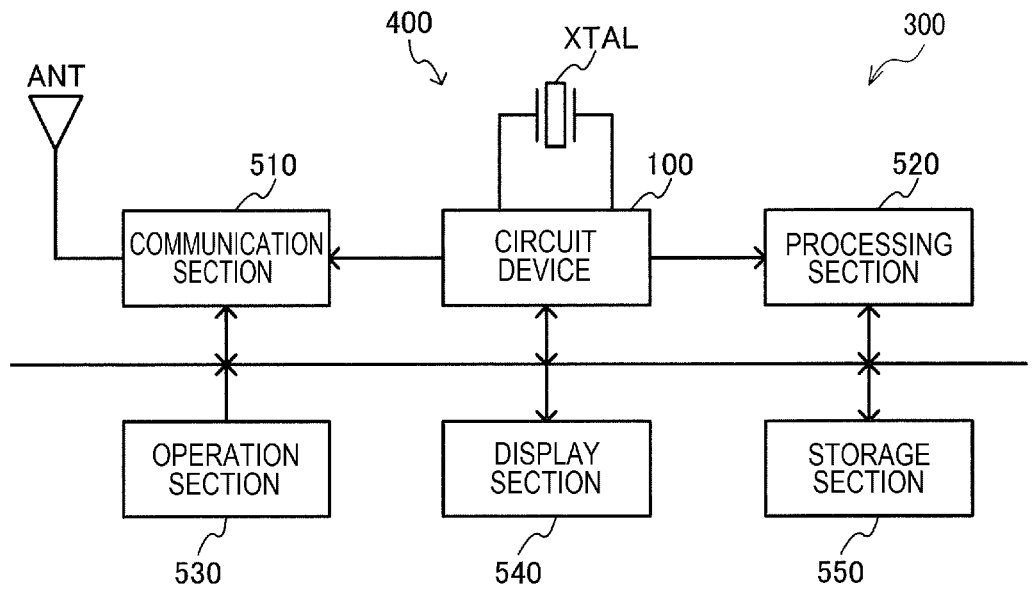
FIG. 9 is a diagram showing a configuration example of an electronic apparatus.

FIG. 9 shows a configuration example of an electronic apparatus 300 including the circuit device 100. The electronic apparatus 300 includes the oscillator 400 having the circuit device 100 and the resonator XTAL, and a processing section 520. Further, the electronic apparatus 300 can include a communication section 510, an operation section 530, a display section 540, a storage section 550, and an antenna ANT.

As the electronic apparatus 300, a variety of types of equipment can be assumed. For example, there can be assumed wearable equipment such as a timepiece incorporating a GPS, biological information measurement equipment or a head-mounted display device. The biological information measurement equipment is a sphygmograph, a pedometer or the like. Alternatively, there can be assumed a portable information terminal such as a smartphone, a mobile phone, a portable game console, a laptop PC or a tablet PC. Alternatively, there can be assumed a content supply terminal for delivering contents, video equipment such as a digital camera or a video camera, or network-related equipment such as a base station or a router. Alternatively, there can be assumed measurement equipment for measuring a physical quantity such as a distance, time, a flow speed or a flow rate, in-car equipment, a robot and so on. The in-car equipment is equipment for automated driving, or the like.

The communication section 510 performs a process of receiving data from the outside and transmitting data to the outside via the antenna ANT. The communication section 510 is, for example, a communication circuit. The processing section 520 performs a control process of the electronic apparatus, a variety of types of digital processing of the data transmitted or received via the communication section 510. The function of the processing section 520 can be realized by a processor such as a microcomputer. The operation section 530 is for the user to perform an input operation, and can be realized by operation buttons, a touch panel display, or the like. The operation section 530 is, for example, an operation device. The display section 540 is for displaying a variety of types of information, and can be realized by a display using a liquid crystal, an organic EL, or the like. The storage section 550 is for storing the data, and the function thereof can be realized by a semiconductor memory such as a RAM or a ROM, a hard disk drive, or the like.

Figure 10:
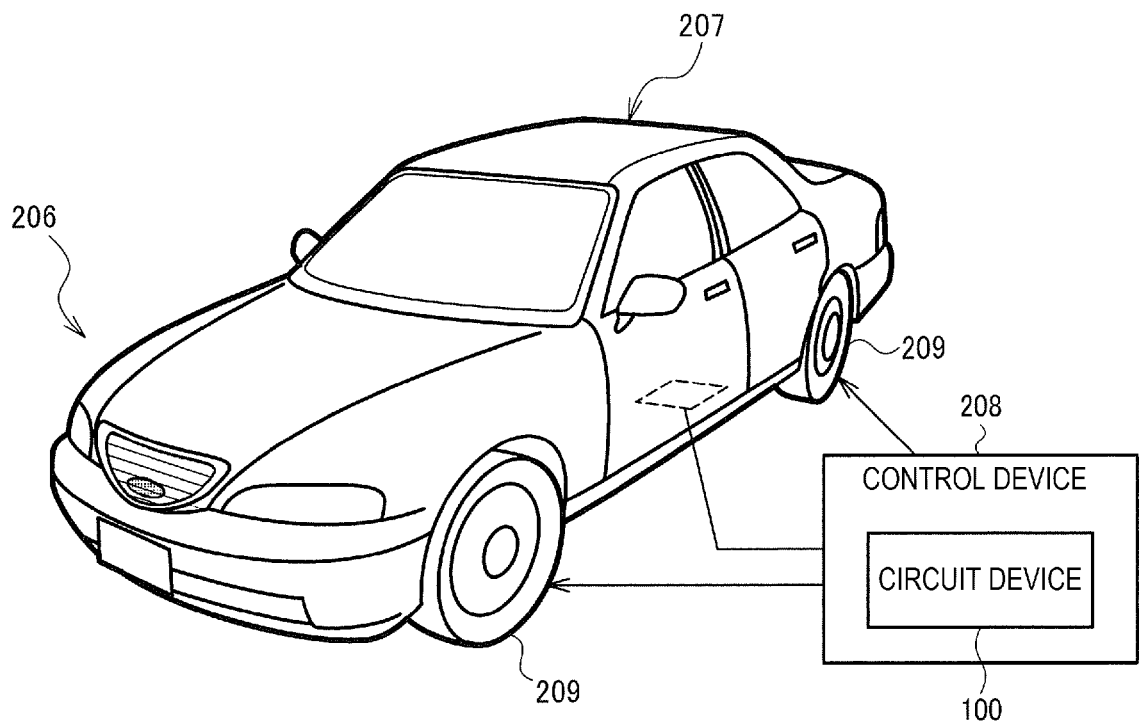
FIG. 10 is a diagram showing an example of a vehicle.

FIG. 10 shows an example of a vehicle including the circuit device 100. The circuit device 100 can be incorporated in a variety of vehicles such as a car, an airplane, a motorbike, a bicycle, a robot, a ship, and a boat. The vehicle is equipment or a device provided with a drive mechanism such as an engine or an electric motor, a steering mechanism such as a steering wheel or a helm, and a variety of electronic apparatuses, and moving on the ground, in the air, or on the sea. FIG. 10 schematically shows a car 206 as a specific example of the vehicle. The car 206 incorporates an oscillator not shown including the circuit device 100. The control device 208 performs a variety of control processes based on the clock signal generated by the oscillator. The control device 208 controls the stiffness of the suspension in accordance with, for example, the attitude of a car body 207, and controls the brake of each of the wheels 209. It should be noted that the equipment incorporating the circuit device 100 or the oscillator is not limited to such a control device 208, but the circuit device 100 or the oscillator can be incorporated in a variety of equipment provided to the vehicle such as the car 206 or a robot.

It should be noted that although the present embodiment is hereinabove described in detail, it should easily be understood by those skilled in the art that it is possible to make a variety of modifications not substantially departing from the novel matters and the advantage of the present disclosure. Therefore, all of such modified examples should be included in the scope of the present disclosure. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the present disclosure. Further, the configurations and the operations of the circuit device, the oscillator, the electronic apparatus, and the vehicle are not limited to those described in the present embodiment, but can be implemented with a variety of modifications.

What is claimed is:

1. A circuit device comprising:
an oscillation signal generation circuit configured to, using frequency control data and a resonator, generate an oscillation signal with an oscillation frequency set by the frequency control data; and
a processing circuit that receives the oscillation signal and a reference signal, and that outputs the frequency control data to the oscillation signal generation circuit,
wherein
the processing circuit includes
a counter configured to perform, based on the oscillation signal, a count process cycle set by a frequency control word, and
a latch circuit configured to hold a count value of the counter based on the reference signal, and
the processing circuit
performs a loop filter process on a phase comparison result based on output data of the latch circuit to output the frequency control data,
holds information based on the phase comparison result when holdover due to disappearance or a defect of the reference signal is detected, and
outputs the frequency control data based on the information held, in a holdover period.

2. The circuit device according to claim 1, wherein
the counter performs the count process during the holdover period, and
when recovering from the holdover, the latch circuit latches the count value of the counter with an edge of the reference signal when the reference signal is determined to be normal, and the processing circuit performs the loop filter process on the phase comparison result based on the output data of the latch circuit to output the frequency control data.

3. The circuit device according to claim 1, wherein
the latch circuit outputs data having a value in a range from −N set by the frequency control word to M set by the frequency control word as the output data of the latch circuit based on the count value held, wherein N is an integer no smaller than 2 and M is an integer no smaller than 2.

4. The circuit device according to claim 3, wherein
the counter performs the count process from an initial value to the M, and then performs the count process from the −N to the initial value, and the latch circuit outputs the count value held as the output data of the latch circuit.

5. The circuit device according to claim 1, wherein
when the reference signal is determined to be normal after startup of the circuit device, the processing circuit sets an initial value to the counter at an edge timing of the reference signal to start the count process of the counter.

6. The circuit device according to claim 5, wherein
the processing circuit includes a second counter configured to count a number of clocks of the oscillation signal in one cycle of the reference signal, and determines whether or not the reference signal is normal based on a count value of the second counter.

7. An oscillator comprising:
the circuit device according to claim 1; and
the resonator.

8. An electronic apparatus comprising:
the circuit device according to claim 1.

9. A vehicle comprising:
the circuit device according to claim 1.

* * * * *